(12) United States Patent
Beukema et al.

(10) Patent No.: US 8,543,079 B2
(45) Date of Patent: Sep. 24, 2013

(54) RECEIVER AND INTEGRATED AM-FM/IQ DEMODULATORS FOR GIGABIT-RATE DATA DETECTION

(75) Inventors: Troy J. Beukema, Briarcliff Manor, NY (US); Scott K. Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/589,680

(22) Filed: Aug. 20, 2012

(65) Prior Publication Data

US 2013/0045701 A1    Feb. 21, 2013

Related U.S. Application Data

(60) Division of application No. 12/177,252, filed on Jul. 22, 2008, now Pat. No. 8,249,542, which is a continuation of application No. 11/345,159, filed on Jan. 31, 2006, now Pat. No. 7,512,395.

(51) Int. Cl.
    *H04B 1/28*      (2006.01)

(52) U.S. Cl.
    USPC ........ 455/333; 455/190.1; 455/214; 455/336; 333/252; 333/307

(58) Field of Classification Search
    USPC ........... 455/188.1, 190.1, 323, 333, 334–336, 455/341; 333/252, 307
    See application file for complete search history.

(56) References Cited

U.S. PATENT DOCUMENTS

| | | | |
|---|---|---|---|
| 3,665,507 A | 5/1972 | Peil | |
| 3,673,505 A | 6/1972 | Limberg | |
| 3,691,465 A | 9/1972 | McFadyen | |
| 3,705,355 A | 12/1972 | Palmer | |
| 3,792,364 A | 2/1974 | Ananias | |
| 3,882,398 A | 5/1975 | Ogita et al. | |
| 3,965,435 A | 6/1976 | Kriedt | |

(Continued)

FOREIGN PATENT DOCUMENTS

| | | |
|---|---|---|
| CN | 1706107 A | 12/2005 |
| JP | 57068012 | 4/1982 |

(Continued)

OTHER PUBLICATIONS

International Search Report from international Application No. PCT/EP2007/050652 mailed Aug. 10, 2007.

(Continued)

*Primary Examiner* — Nhan Le
(74) *Attorney, Agent, or Firm* — Ference & Associates LLC

(57) ABSTRACT

Provision of gigabit-rate data transmission over wireless radio links, using carrier frequencies in the millimeter-wave range (>30 GHz). More specifically, a circuit for detection of amplitude-shift keyed (ASK) or other amplitude modulations (AM) which can be easily incorporated into an integrated circuit receiver system is described, making the receiver capable of supporting both complex IQ modulation schemes and simpler, non-coherent on-off or multiple-level keying signals. Several novel radio architectures are also described which, with the addition of a frequency discriminator network, have the capability of handling frequency shift keyed (FSK) or other frequency modulations (FM), as well as AM and complex IQ modulation schemes. These radio architectures support this wide variety of modulations by efficiently sharing detector hardware components. Disclosed herein are architecture for supporting both quadrature down-conversion and ASK/AM, ASK/AM detector circuit details, AM-FM detector architecture, and an AM-FM/IQ demodulator system and FSK/FM detector circuit details.

7 Claims, 14 Drawing Sheets

(56) References Cited

U.S. PATENT DOCUMENTS

| | | |
|---|---|---|
| 4,000,472 A | 12/1976 | Eastland |
| 4,250,457 A | 2/1981 | Hofmann |
| 4,307,347 A | 12/1981 | Thomson |
| 4,320,346 A | 3/1982 | Healy |
| 4,359,683 A | 11/1982 | Sauer |
| 4,492,926 A | 1/1985 | Kusakabe |
| 4,566,133 A | 1/1986 | Rambo |
| 4,660,192 A | 4/1987 | Pornatto, Sr. |
| 4,945,313 A | 7/1990 | Brikla et al. |
| 5,020,147 A | 5/1991 | Okanobu |
| 5,379,445 A * | 1/1995 | Arnstein et al. ............. 455/13.4 |
| 5,579,373 A | 11/1996 | Jang |
| 5,657,026 A | 8/1997 | Culpepper et al. |
| 5,774,195 A | 6/1998 | Miyahara et al. |
| 6,078,628 A | 6/2000 | Griffin |
| 6,230,000 B1 | 5/2001 | Tayloe |
| 6,297,691 B1 | 10/2001 | Anderson |
| 6,452,977 B1 | 9/2002 | Goldston |
| 6,539,064 B1 | 3/2003 | Ellis |
| 6,639,509 B1 | 10/2003 | Martinez |
| 6,650,717 B1 | 11/2003 | Cupo |
| 6,690,746 B1 | 2/2004 | Sills |
| 6,909,883 B2 | 6/2005 | Fujiwara |
| 7,039,376 B2 * | 5/2006 | Isoda ......................... 455/232.1 |
| 7,197,279 B2 * | 3/2007 | Bellantoni ................... 455/41.2 |
| 7,266,361 B2 | 9/2007 | Burdett |
| 7,299,029 B2 | 11/2007 | Elder et al. |
| 7,512,395 B2 | 3/2009 | Beukema et al. |
| 2003/0147475 A1 | 8/2003 | Sasabata |
| 2004/0081253 A1 | 4/2004 | Chethik |
| 2004/0218686 A1 * | 11/2004 | Pastemak et al. ............. 375/272 |
| 2005/0003781 A1 | 1/2005 | Kunz |
| 2005/0046507 A1 | 3/2005 | Dent |
| 2005/0185727 A1 | 8/2005 | Tanaka |
| 2006/0068746 A1 * | 3/2006 | Feng et al. .................... 455/323 |

FOREIGN PATENT DOCUMENTS

| | | |
|---|---|---|
| JP | 2002368829 | 12/2002 |
| JP | 2004147052 | 5/2004 |
| WO | WO2004/003677 | 4/2004 |

* cited by examiner

US 8,543,079 B2

RECEIVER AND INTEGRATED AM-FM/IQ DEMODULATORS FOR GIGABIT-RATE DATA DETECTION

CROSS REFERENCE TO RELATED APPLICATIONS

This application is a divisional application of U.S. patent application Ser. No. 12/177,252, filed on Jul. 22, 2008 now U.S. Pat. No. 8,249,542, which itself is a continuation application of U.S. patent application Ser. No. 11/345,159 (now U.S. Pat. No. 7,512,395), filed on Jan. 31, 2006, the contents of both of which are hereby fully incorporated by reference in their entirety.

FIELD OF THE INVENTION

The present invention relates generally to data transmission over wireless radio links, and more particularly to a detector and receivers for providing fast data transmission over wireless radio links.

BACKGROUND OF THE INVENTION

Gigabit-rate data transmission has been achieved in the 60-GHz Industrial, Scientific, and Medical (ISM) band using ASK modulation with transceiver modules consisting of several GaAs integrated circuits (ICs) mounted on a ceramic substrate. An example of such prior art technology can be found in a publication by K. Ohata et al., "Wireless 1.25 Gb/s Transceiver Module at 60-GHz Band". It is a goal of the present invention to provide a single-IC receiver or transceiver in less expensive silicon process technology which supports multiple modulation formats, including ASK modulation.

Product detectors are well known in the literature for detection of ASK or AM signals. Examples of such detectors in the prior art include an excerpt from *Solid-State Radio Engineering* by Krauss, Bostian, and Raab, and from *Radio-Frequency Electronics* by Hagen. This disclosure describes an improved product detector which is capable of operation at gigabit data rates and with good linearity on millivolt-level IF input signals, which has high input impedance so as not to detune the IF input circuit to which it is connected, and which can be easily powered down so as not to load the IF input circuit or consume power when the receiver is used in other modulation modes.

SUMMARY OF THE INVENTION

This disclosure relates to the goal of providing gigabit-rate data transmission over wireless radio links, using carrier frequencies in the millimeter-wave range (>30 GHz). More specifically, it describes a circuit for detection of amplitude-shift keyed (ASK) or other amplitude modulations (AM) which can be easily incorporated into an integrated circuit receiver system, making the receiver capable of supporting both complex IQ modulation schemes and simpler, non-coherent on-off or multiple-level keying signals.

This disclosure also describes several novel radio architectures which, with the addition of a frequency discriminator network, have the capability of handling frequency shift keyed (FSK) or other frequency modulations (FM), as well as AM and complex IQ modulation schemes. These radio architectures support this wide variety of modulations by efficiently sharing detector hardware components. The architecture for supporting both quadrature down-conversion and ASK/AM is described first, followed by the ASK/AM detector circuit details, then the AM-FM detector architecture, and finally the most general AM-FM/IQ demodulator system concept and the FSK/FM detector circuit details.

In one aspect, the present invention broadly contemplates a receiver, comprising a first stage down-conversion mixer, a mixer as the detector, an amplifier in the mixer's RF-input signal path, an amplifier in the mixer's LO-input signal path, wherein the amplifier in the mixer's RF-input signal path provides a low-gain, linear path to the mixer's RF-input, wherein the amplifier in the mixer's LO-input signal path provides a high-gain path to the mixer's LO-input, and wherein both amplifiers have matched delays.

In another aspect, the present invention broadly contemplates an integrated radio receiver device comprising a first stage down-conversion mixer; an optional IF amplifier; an IQ down-converter; an AM detector at the output of the first stage down-conversion mixer or optional IF amplifier; and a multiplexing capability of an I/Q channel down conversion and a detected AM envelope into a baseband amplification chain. The IF amplifier may act as both an amplifier and a filter. The signal is commonly band-limited prior to detection for optimum performance, and this band-limiting normally happens at IF.

In a third aspect, the present invention broadly contemplates a receiver, comprising a first stage down-conversion mixer, a double balanced mixer as the detector; an amplifier in the mixer's RF-input signal path; an amplifier in the mixer's LO-input signal path; wherein the amplifier in the mixer's RF-input signal path provides a low-gain, linear path to the mixer's RF-input; wherein the amplifier in the mixer's LO-input signal path provides a high-gain path to the mixer's LO-input, wherein both amplifiers have matched delays.

In a fourth aspect, the present invention broadly contemplates an AM-FM detector comprising a merger which merges an AM product detector with a delay-line FM detector, such that the AM product detector hardware is re-used in the delay-line FM detector; wherein the FM detector is implemented using only an additional discriminator phase shift network.

In a fifth aspect, the present invention broadly contemplates an integrated radio receiver device, comprising a first stage down-conversion mixer; an optional IF amplifier; an IQ down-converter; an AM detector at the output of the first stage down-conversion mixer or optional IF amplifier; and an FM detector at the output of the first stage down-conversion mixer or optional IF amplifier, wherein the device supports more than one type of modulation scheme.

For a better understanding of the present invention, together with other and further features and advantages thereof, reference is made to the following description, taken in conjunction with the accompanying drawings, and the scope of the invention will be pointed out in the appended claims.

DETAILED DESCRIPTION OF THE PREFERRED EMBODIMENTS

Figure 1:
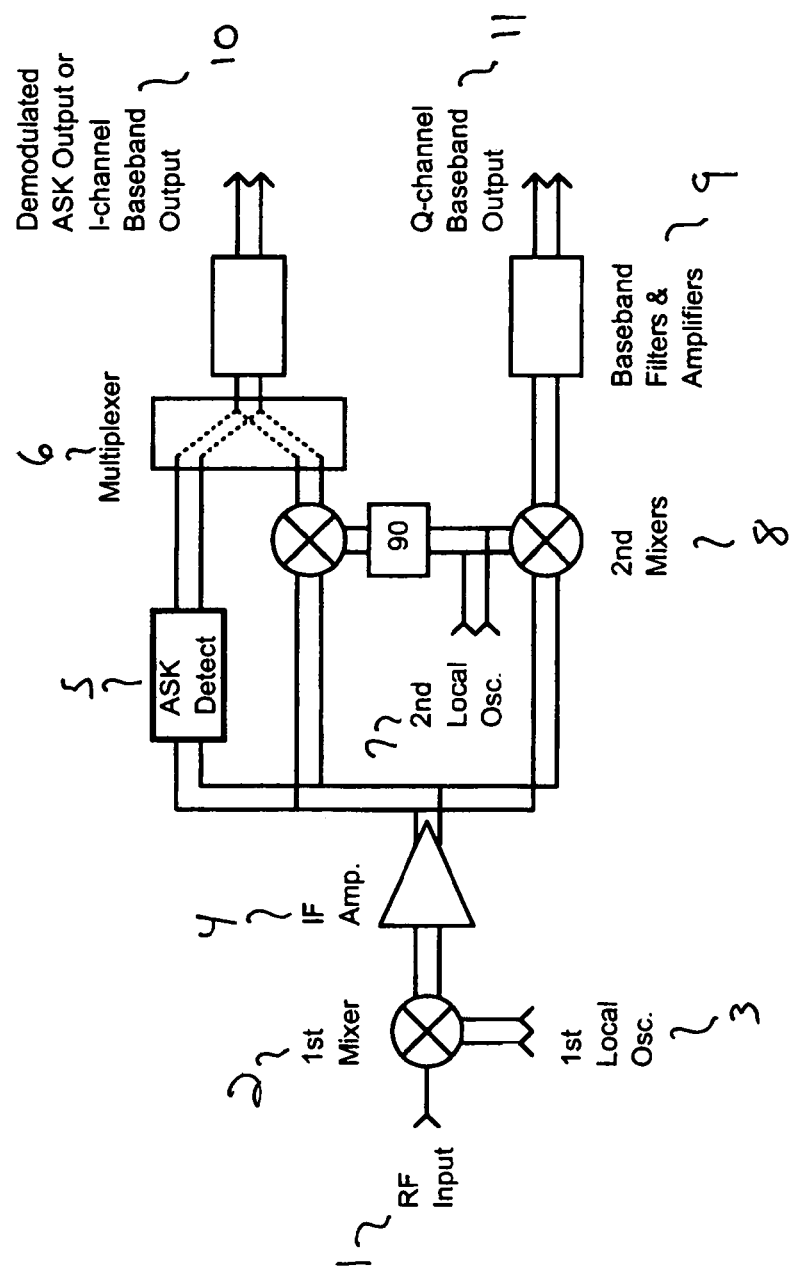
FIG. 1 is an overall system block diagram of a presently preferred embodiment of the present invention.

FIG. 1 shows our novel radio architecture incorporating both quadrature down-conversion and an active ASK/AM detector at the intermediate frequency. The ASK/AM detector output is multiplexed with the I-channel down-conversion output to enable re-use of the existing baseband low-pass filter and amplifier to filter and amplify the detected ASK/AM signal. An integrated AM detector increases the application space of a 60 GHz receiver by providing the ability to detect non-coherent on-off keying signals and other amplitude-shift-keyed modulations. These non-coherent modulation formats simplify a radio system design by eliminating the need for carrier phase recovery or other complex baseband IQ signal processing to demodulate received data. ASK/AM formats are suitable for highly directional wireless data links which do not suffer from interfering or reflected signals. Complex baseband IQ signal processing, on the other hand, provides the capability of rejecting interfering and reflected signals, as might be required in an omni-directional wireless data link. Thus, a receiver capable of detecting both modulation modes has wider application.

Figure 2:
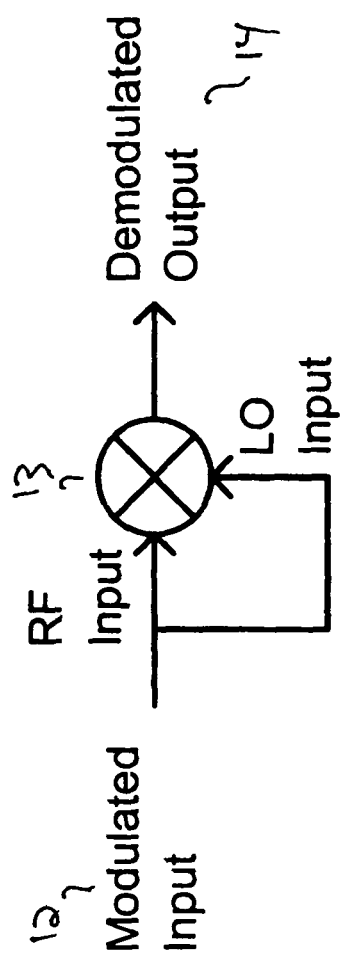
FIG. 2 is a product detector that can be found in the prior art.
Figure 3:
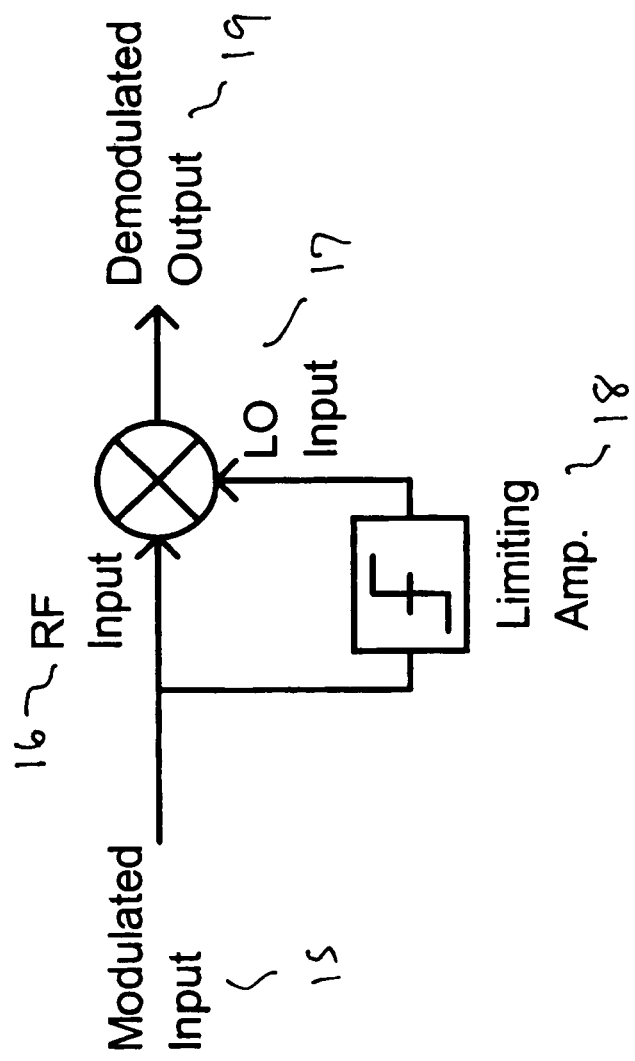
FIG. 3 is another product detector that can be found in the prior art.

FIGS. 2 and 3 show product detectors that might be used as the ASK detector in FIG. 1, as described in prior art. FIG. 2 is a conceptual diagram showing the modulated input signal (12) applied to both inputs of a mixer (13). Without specifying the implementation details of the mixer, it is impossible to know the transfer function of this arrangement, but if the mixer has equal conversion gains through both inputs, then the output signal (14) is the square of the input signal, an approximation of the desired absolute value function.

Figure 4:
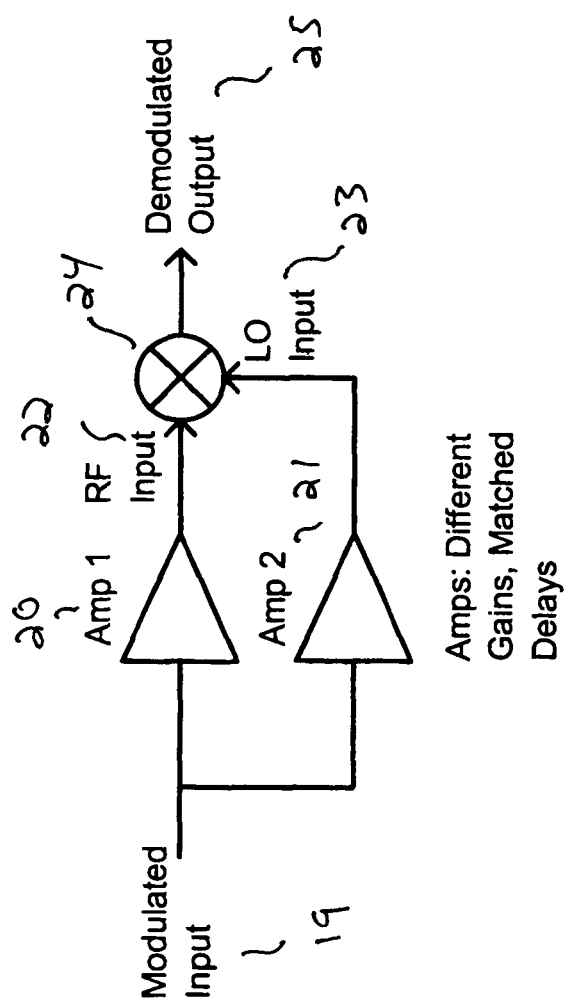
FIG. 4 is a product detector implementation of a presently preferred embodiment of the present invention.

Many practical mixer circuits do not have equal conversion gains through both inputs, but rather require a relatively large amplitude signal through one input (the LO-input in FIGS. 2-4) and provide a relatively high conversion gain and a linear response characteristic through the other input (the RF-input in FIGS. 2-4). FIG. 3 shows a more realistic product detector which uses a limiter or limiting amplifier (18) to provide an approximately constant input signal level to the mixer's LO-input (17). If the mixer's LO-input has a sufficiently large signal level, this circuit provides a closer approximation to the desired absolute value function.

Figure 5:
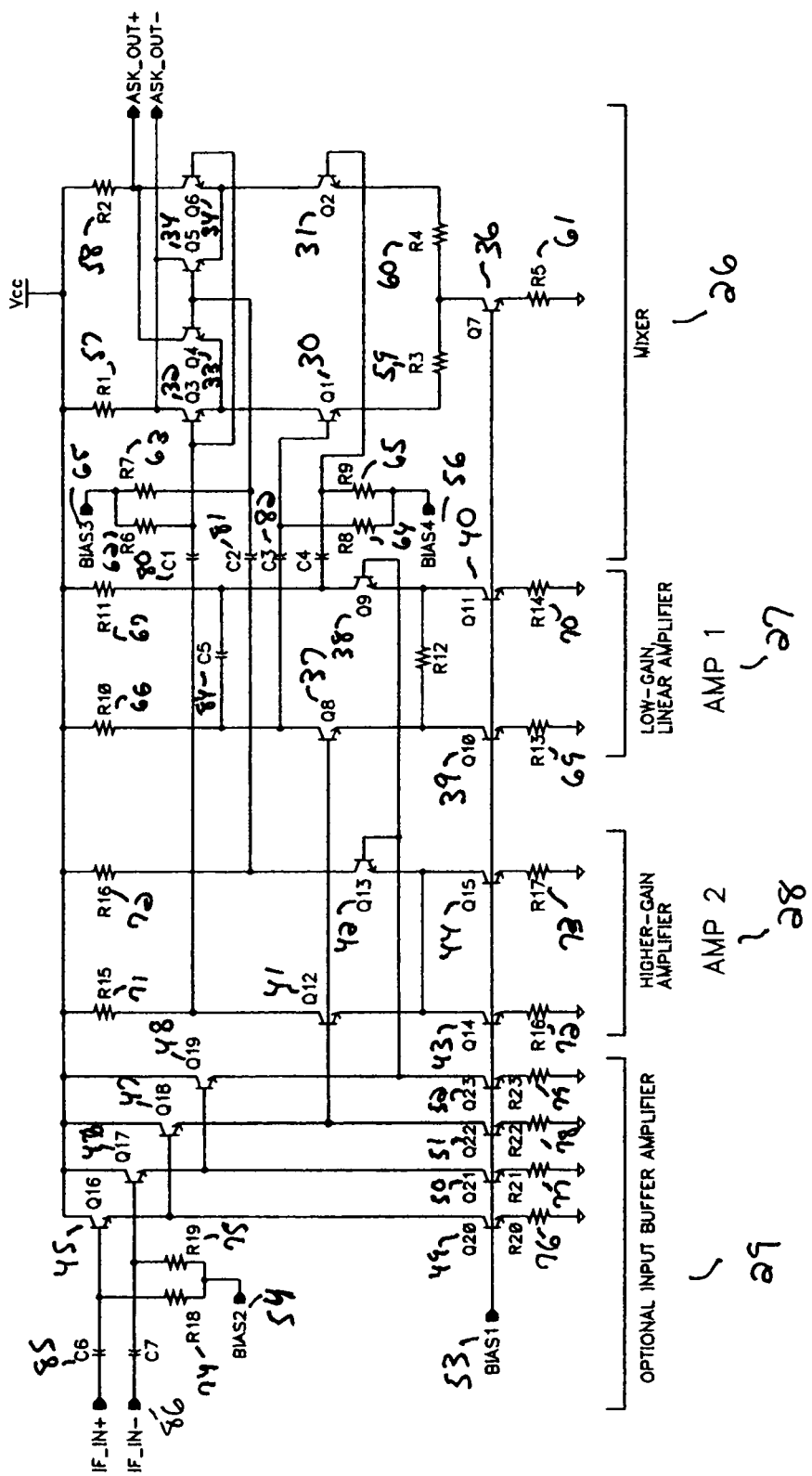
FIG. 5 is a circuit implementation of a product detector of a presently preferred embodiment of the present invention.

The circuit in FIG. 3 will not work properly at high data rates and low input-signal levels because it does not provide a capability for time-aligning the mixer's RF- and LO-input signals (16 and 17, respectively). If the two input signals to the mixer are misaligned, the detector's output amplitude is reduced and the output pulse is broadened, lowering the detector's effective bandwidth. Circuit simulations indicate that alignment of the two signals within 10-20 degrees of a cycle at the highest input modulation frequency is desirable, which corresponds to 28-56 ps at a modulating frequency of 1 GHz. An improved product detector which provides the capability of time-aligning the input signals is shown in FIGS. 4 and 5. This improved product detector also has high input impedance so as not to detune the IF input circuit to which it is connected, and it can be easily powered down so as not to load the IF input circuit or consume power when the receiver is used in other modulation modes, all features which are advantageous for practical implementation of the architecture in FIG. 1.

Referring to FIG. 5, our implementation of the ASK/AM detector includes a double balanced mixer (26) as the detector, and amplifiers in the mixer's RF- and LO-input signal paths, labeled amplifier 1 (27) and amplifier 2 (28), respectively. Amplifier 2 (28) provides a relatively high-gain path to the mixer's LO-input, while amplifier 1 (27) provides a relatively lower-gain, linear path to the mixer's RF-input. The two amplifiers are designed to have matched delays. This is accomplished by using amplifiers which are topologically similar. Resistor R12 (68) reduces the gain and linearizes amplifier 2 (28), which consists of Q8-11 (37-40) and R10-14 (66-70), while C5 (optional) (84) helps to match the delays and bandwidths of amplifiers 1 (27) and 2 (28). That is, the inclusion of degeneration resistor R12 (68) may increase the bandwidth and reduce the delay of amplifier 1 (27) due to the negative feedback it creates, and the inclusion of C5 (84) increases the delay and reduces the bandwidth of amplifier 1 (27) to match amplifier 2 (28), compensating for R12 (68). In many cases, C5 (84) may be unnecessary, and the amplifier delays may be adequately matched due to the topological similarity.

FIG. 4 shows the general circuit architecture which has been implemented in FIG. 5, with Amplifier 1 (20) in FIG. 4 corresponding to Amplifier 1 (27) in FIG. 5, etc. The detailed circuit in FIG. 5 also includes an optional input buffer amplifier (29) to raise the input impedance of the circuit, so that it does not load or detune the IF circuitry in FIG. 1.

Circuit simulations were performed on the entire receiver with ASK demodulator, the partial block diagram of which is shown in FIG. 1. The detailed circuit which was actually simulated included a low-noise amplifier with a gain of 20 dB preceding the RF-input (1) shown in FIG. 1. The mixer (2) and the IF amplifier (4) each have a gain of 10 dB, for a total of 40 dB gain between the LNA input and the IF amplifier output. The circuit was simulated for LNA-referred signal levels of −65 dBm to −35 dBm, which resulted in IF signals in the range of 5-500 mV peak at the ASK detector input. The RF-input frequency was 64 GHz and the IF 9.1 GHz.

Figure 6:
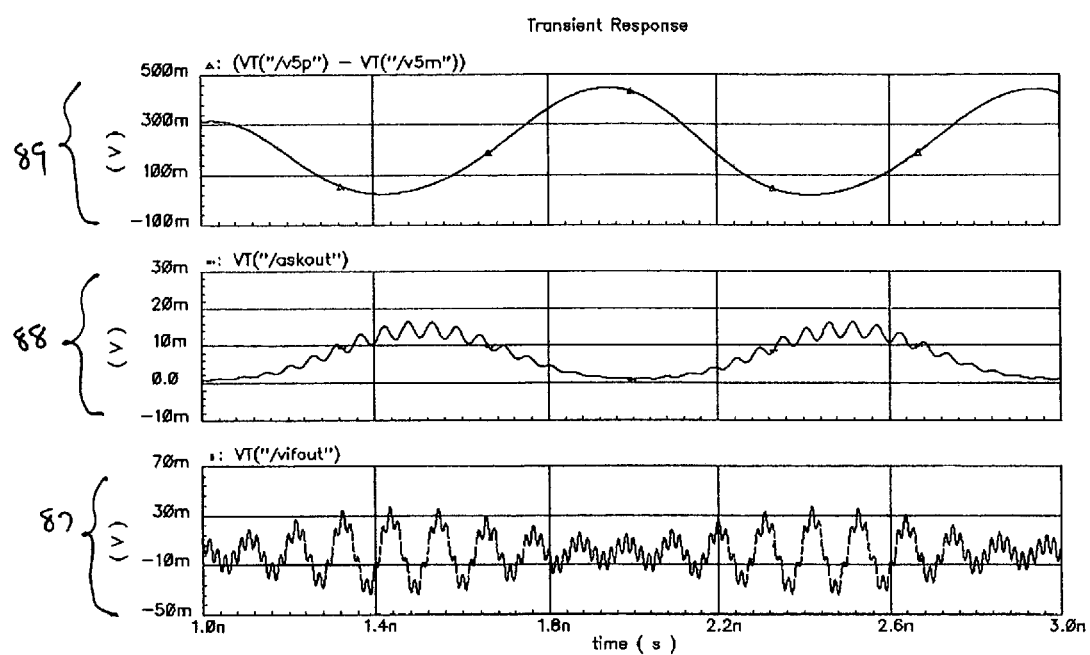
FIG. 6 is a screenshot of simulation results for a receiver of an embodiment of the instant invention.

The simulation results shown in FIG. 6 are for a 1 GHz sinusoidal amplitude modulation of the RF input with 0.9 modulation index. The lower trace (87) in FIG. 6 is the IF waveform (amplitude vs. time), the middle trace (88) is ASK detector output waveform, and the top trace (89) is the detected ASK output after low-pass filtering and amplification through the baseband amplifier. It can be seen that the circuit in FIG. 5 closely approximates the absolute value of the input signal, which when low-pass filtered re-generates the AM or ASK signal. A 1 GHz sinusoidal modulation is roughly equivalent to on-off (2-level ASK) keying at 2 Gb/s.

Figure 7:
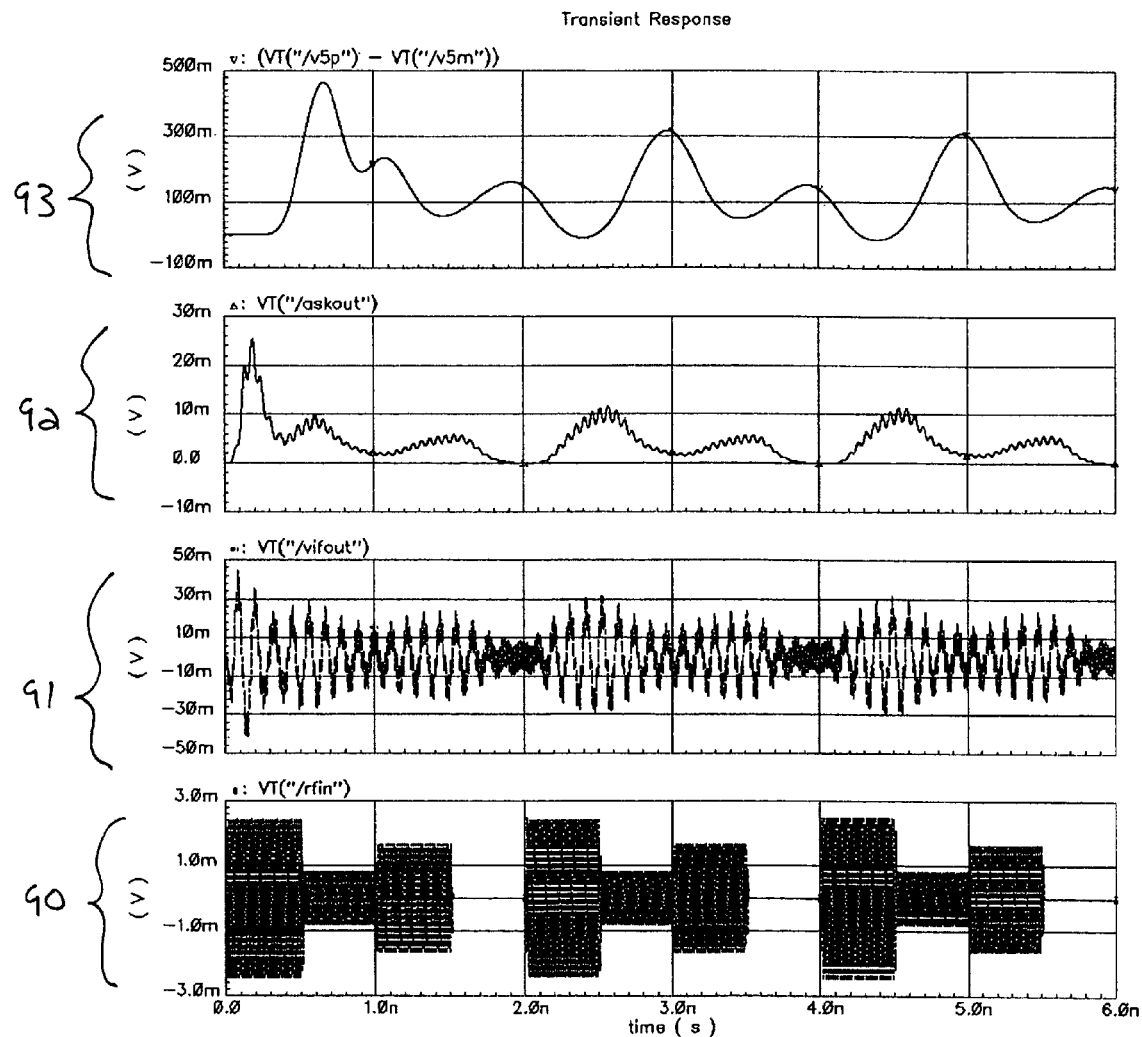
FIG. 7 is a screenshot of simulation results for a receiver of another embodiment of the instant invention.

The simulation results shown in FIG. 7 are for the entire receiver with the integrated product detector, using a 4-level ASK input at 2 G Symbols/s, which is equivalent to a data rate of 4 Gb/s. The lower trace (90) is the RF input waveform (amplitude vs. time) showing four amplitude levels, the 2$^{nd}$ from the bottom (91) is the IF waveform, the 3$^{rd}$ from the bottom (92) is the ASK detector output waveform, and the top (94) is the demodulated ASK output after amplification and low-pass filtering through the baseband amplifier, showing four distinct demodulated levels.

There is extensive prior art for AM/ASK detectors, as exemplified by numerous references above. The majority of patented circuits are diode-based, such as U.S. Pat. No. 3,691,465 to McFadyen, U.S. Pat. No. 4,000,472 to Eastland, U.S. Pat. No. 4,250,457 to Hofmann, U.S. Pat. No. 4,320,346 to Healey, U.S. Pat. No. 4,359,693 to Sauer, U.S. Pat. No. 4,492,926 to Kusakabe. Other detectors use means other than diodes to achieve rectification, including U.S. Pat. No. 3,673,505 to Limberg, U.S. Pat. No. 3,965,435 to Kriedt, U.S. Pat. No. 4,320,346 to Healey. Among product detectors (that is, mixer- or multiplier-based detectors), including U.S. Pat. No. 3,705,355 to Palmer, U.S. Pat. No. 3,792,364 to Ananias, U.S. Pat. No. 6,230,000 to Tayloe, none were found which employ the matched delay circuitry shown in FIGS. 4-5 of the present invention.

Figure 8:
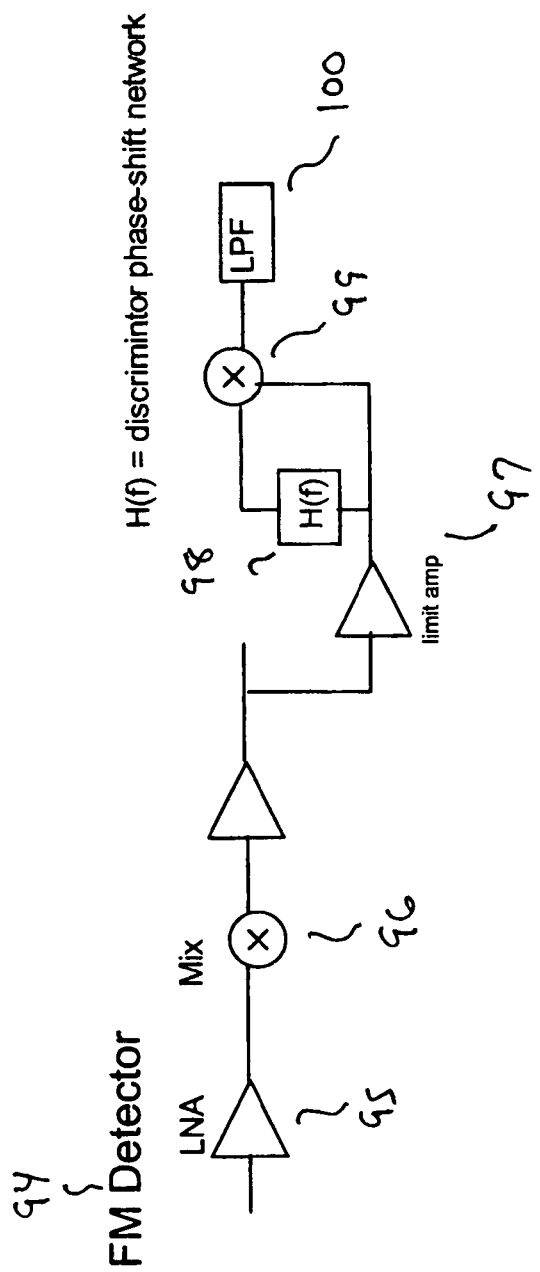
FIG. 8 is an overall system block diagram of another presently preferred embodiment of the present invention.

The concepts in this disclosure can be extended to include detection of FSK/FM signals as well, with the addition of a discriminator phase-shift network, as shown in FIG. 8. The FSK/FM detector (94) is built using many of the same components as the earlier ASK/AM detector. The phase-shift network H(f) (98) is designed to have 90° of phase shift at the IF carrier frequency. This circuit is well known in the literature and is variously called a delay-line FM detector or quadrature FM demodulator.

Figure 9:
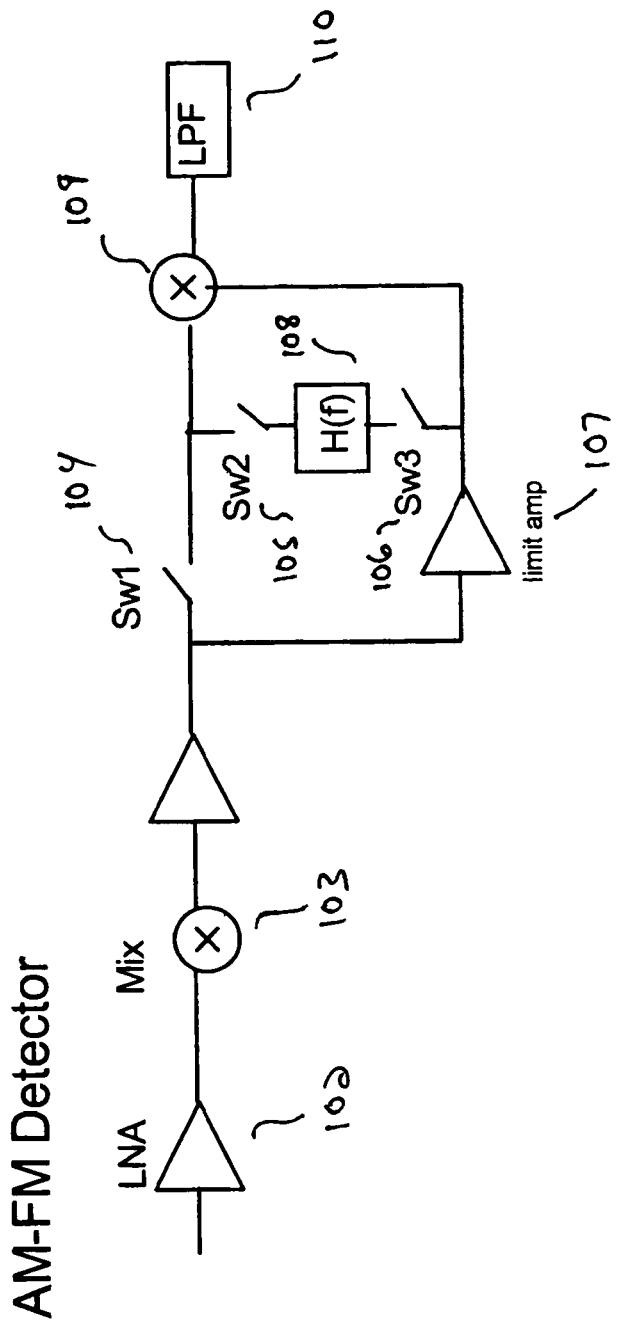
FIG. 9 is a product detector implementation of another presently preferred embodiment of the present invention.

FIG. 9 shows how this delay-line FM detector can be merged with an AM product detector into a radio architecture which can demodulate either ASK/AM or FSK/FM signals. Referring to FIG. 9, closing the switch Sw1 (104) and opening switches Sw2 (105) and Sw3 (106) configures the detector as an AM product detector as shown in FIG. 3. Closing Sw2 (105) and Sw3 (106) and opening Sw1 (104) configures the detector as a delay-line FM detector, as shown in FIG. 8.

Figure 10:
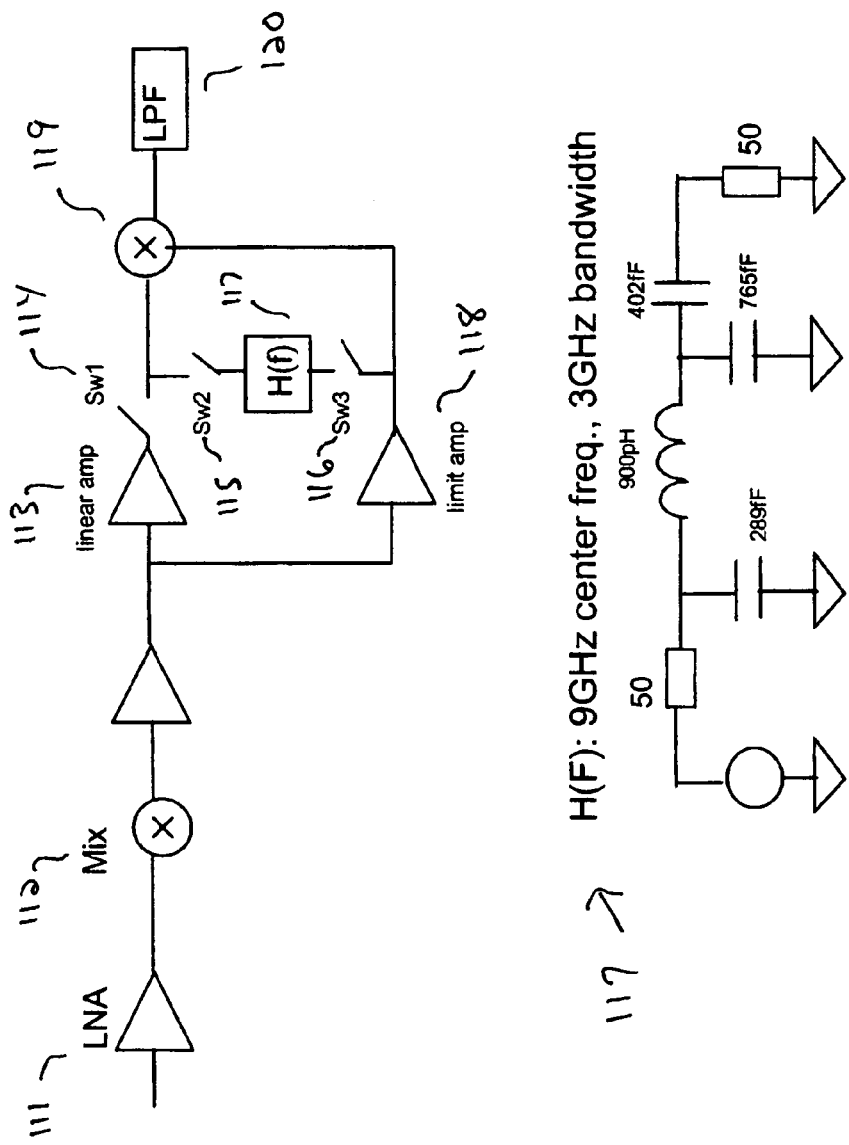
FIG. 10 is a more specific implementation of the product detector of FIG. 9.

FIG. 10 shows a more specific implementation of the AM-FM detector architecture which includes the improved AM product detector described in FIGS. 4 and 5. In FIG. 10, the two amplifiers used to time-align the input signal in FIG. 4 (Amp 1 (20) and Amp2 (21)) are shown here explicitly as "linear amp" (113) (corresponding to Amp1 (20) in FIG. 4) and "limit amp" (118) (corresponding to Amp 2 (21) in FIG. 4). Also, one possible realization of the discriminator phase-shift network H(f) (117) is shown for a 9-GHz IF, which is the frequency used in our receiver. Referring to FIG. 10, closing the switch Sw1 (114) and opening switches Sw2 (115) and Sw3 (116) configures the detector as an AM product detector as shown in FIG. 4. Closing Sw2 (115) and Sw3 (116) and opening Sw1 (114) configures the detector as a delay-line FM detector, as shown in FIG. 8.

Figure 11:
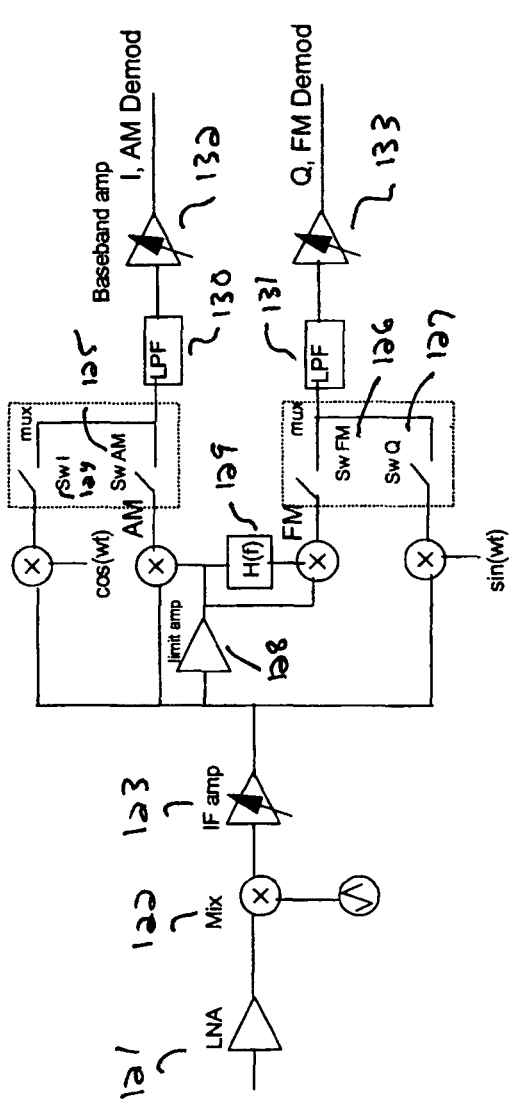
FIG. 11 is an overall system block diagram of another presently preferred embodiment of the present invention.

FIG. 11 is the most general receiver architecture described. It supports three different modulations: complex IQ modulation schemes, ASK/AM, and FSK/FM. With switches SwI (124) and SwQ (127) closed (and the others open), the architecture provides IQ demodulation. With SwAM (125) closed (and the others open), AM demodulation is provided. With SwFM (126) closed (and the others open), FM demodulation is provided. With both SwAM (125) and SwFM (127) closed (and the others open), simultaneous AM and FM demodulation is provided, which potentially increases the non-coherent data rate by a factor of two. Although not explicitly shown, it should be understood that the improved ASK/AM detector of FIG. 4 could be used in FIG. 11 by providing amplifiers with matched delays in the ASK/AM mixer signal paths. For simultaneous AM and FM demodulation, the AM detector should be as frequency insensitive as possible to limit leakage of FM into its detected output level, and the FM detector should be as amplitude insensitive as possible to limit leakage of AM into its detected output level.

Figure 12:
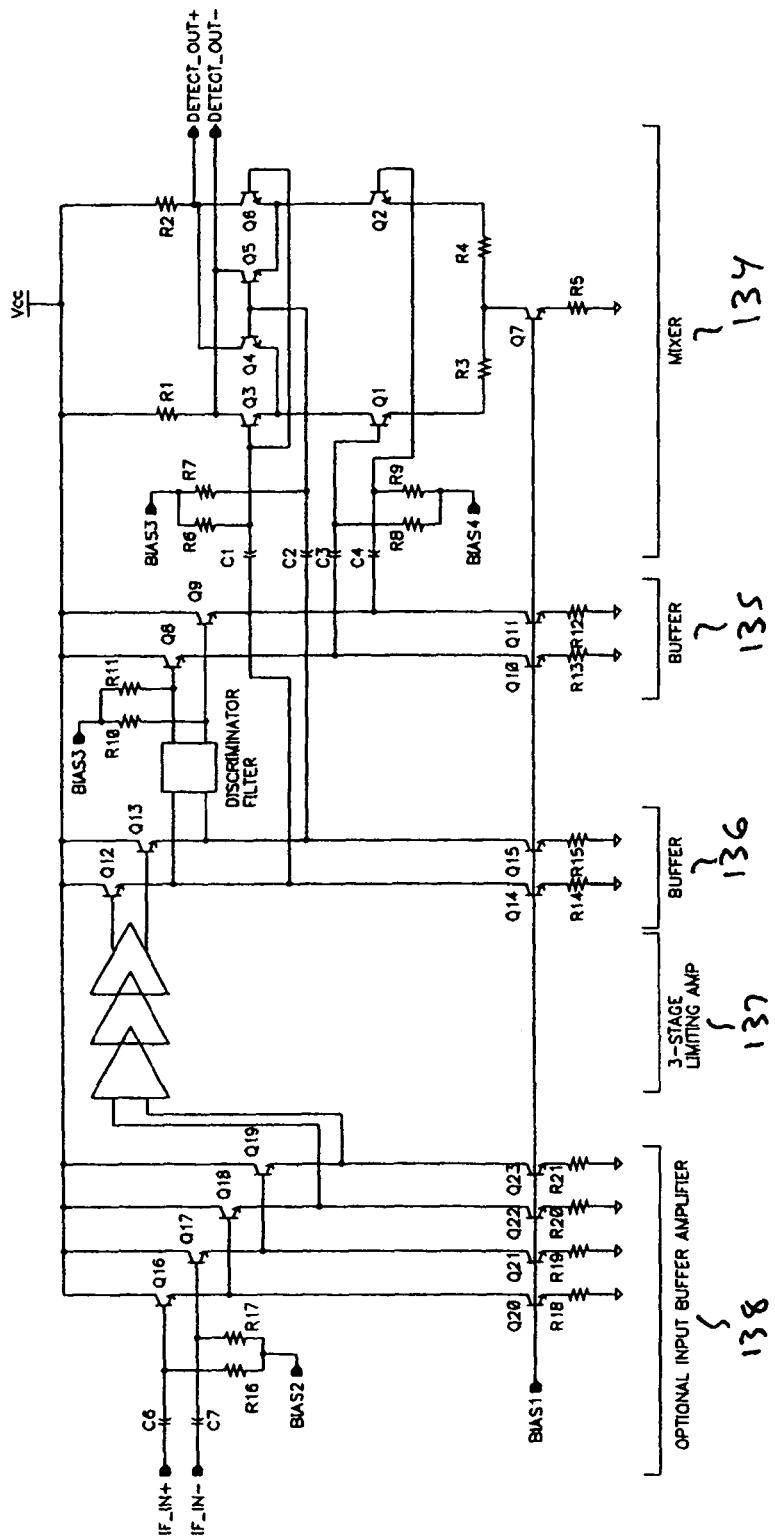
FIG. 12 is a circuit implementation of the embodiment of FIG. 11.

FIG. 12 shows a specific, transistor-level implementation of our FM detector, which was implemented as part of the receiver architecture in FIG. 11. This general type of FM detector is variously known as a delay-line FM detector, or quadrature FM demodulator, or FM limiter-discriminator, and is well known in the literature. Our improved circuit uses a three-stage limiting amplifier (137), each stage of which has amplitude dependent gain. The amplitude-dependent gain provides relatively high gain for low amplitude input signals and lower gain for higher-amplitude input signals. This amplitude-dependent gain provides a more gradual clipping characteristic for higher-amplitude input signals, which minimizes the asymmetry and second-order distortion products present in the output signal, while still providing effective limiting for lower-amplitude input signals. Any asymmetry or second-order distortion in the output signal results in an amplitude-dependent DC offset in the limiter output, which results in poorer rejection of amplitude-modulated signals and a lower signal-to-noise ratio. Thus, our improved limiting amplifier preserves high signal-to-noise ratio in the presence of AM signals, which would be very important in systems which used simultaneous AM and FM modulation, as shown in FIG. 11.

Figure 13:
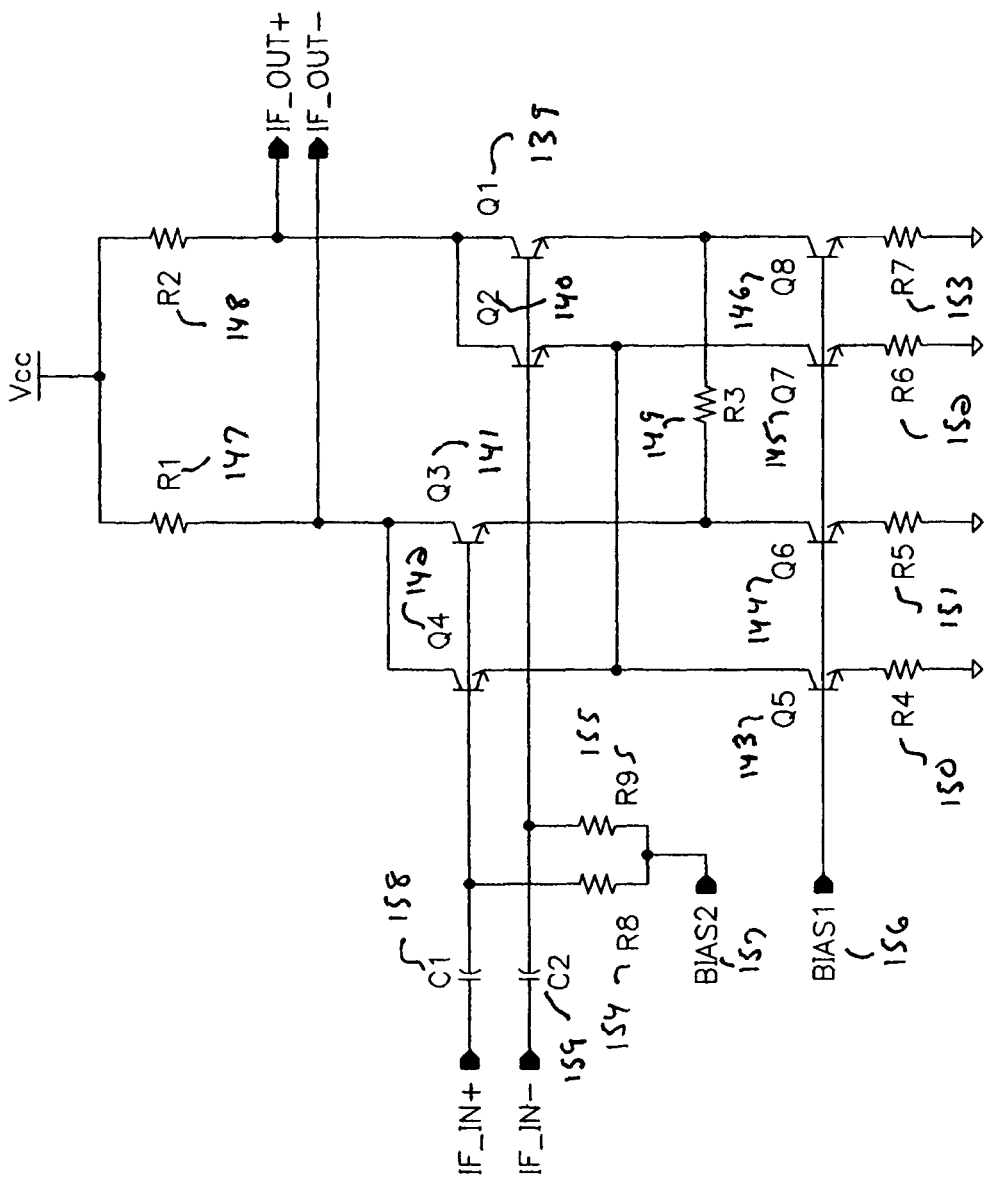
FIG. 13 is a more detailed schematic of the amplifier of FIG. 12.

FIG. 13 reveals details of the limiting amplifiers. Each amplifier stage has two pairs of input transistors, one pair of which is resistively degenerated (Q1 (139), Q3 (141) and R3 (149)) and one pair of which is not (Q2 (140), Q4 (142)). The non-degenerated pair provides high gain for small input signals until the input-signal amplitude reaches the point where the pair's differential output current saturates. The degenerated pair provides lower gain but will accept a larger signal before it saturates. Thus, the overall amplifier's clipping characteristic is made more gradual, providing lower DC offset and fewer second-order distortion products at the output.

Figure 14:
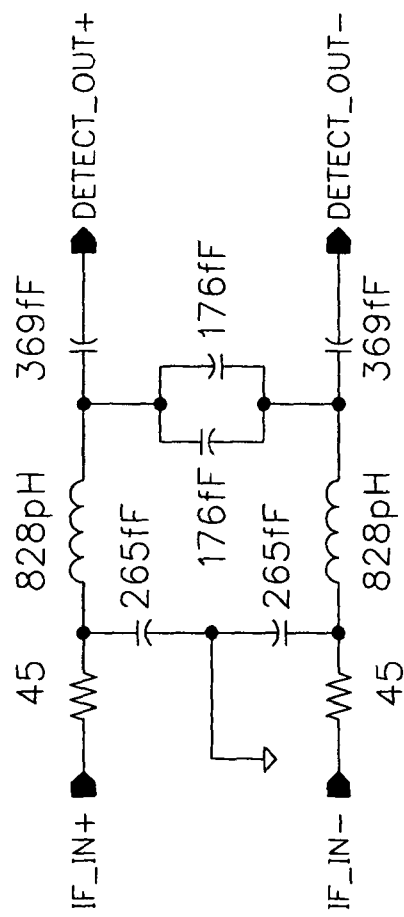
FIG. 14 is a more detailed circuit implementation of the discriminator filter of FIG. 12.

FIG. 14 shows the specific circuit implementation of the discriminator filter used in FIG. 12. It is designed to have 90 degrees of phase shift at the center frequency of 8.9 GHz and provide a phase shift which is linear with deviation in input frequency about this center frequency, over a range up to ±2 GHz. This is a practical differential, on-chip implementation of the theoretical network shown in the FIG. 10 inset.

If not otherwise stated herein, it is to be assumed that all patents, patent applications, patent publications and other publications mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:
1. A receiver, comprising:
a first stage down-conversion mixer;
a double balanced mixer as the detector;
an amplifier in the mixer's RF-input signal path;
an amplifier in the mixer's LO-input signal path;
wherein the amplifier in the mixer's RF-input signal path
provides a low-gain, linear path to the mixer's RF-input;

wherein the amplifier in the mixer's LO-input signal path provides a high-gain path to the mixer's LO-input;

wherein both amplifiers have matched delays.

2. A receiver, comprising:

a first stage down-conversion mixer;

a mixer as the detector;

an amplifier in the mixer's RF-input signal path;

an amplifier in the mixer's LO-input signal path;

wherein the amplifier in the mixer's RF-input signal path provides a low-gain, linear path to the mixer's RF-input;

wherein the amplifier in the mixer's LO-input signal path provides a high-gain path to the mixer's LO-input;

wherein both amplifiers have matched delays.

3. The receiver of claim 2, wherein the mixer is a double balanced mixer.

4. The receiver of claim 2, wherein the mixer is combined with the I-channel mixer.

5. The receiver of claim 2, wherein the mixer is combined with the Q-channel mixer.

6. The receiver of claim 3, wherein the mixer is combined with the I-channel mixer.

7. The receiver of claim 3, wherein the mixer is combined with the Q-channel mixer.

\* \* \* \* \*